United States Patent
Murase et al.

(10) Patent No.: US 11,031,640 B2
(45) Date of Patent: Jun. 8, 2021

(54) BATTERY PACK, BATTERY MONITORING DEVICE, AND VEHICLE

(71) Applicant: TOYOTA JIDOSHA KABUSHIKI KAISHA, Toyota (JP)

(72) Inventors: Masaya Murase, Nagoya (JP); Hiromasa Tanaka, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/687,870

(22) Filed: Nov. 19, 2019

(65) Prior Publication Data

US 2020/0168960 A1    May 28, 2020

(30) Foreign Application Priority Data

Nov. 22, 2018  (JP) .............................. JP2018-219271

(51) Int. Cl.
| | | |
|---|---|---|
| *H01M 10/48* | (2006.01) | |
| *H01M 10/42* | (2006.01) | |
| *G01R 31/3835* | (2019.01) | |
| *G01R 31/396* | (2019.01) | |
| *G01R 31/371* | (2019.01) | |
| *B60L 58/12* | (2019.01) | |
| *B60L 50/64* | (2019.01) | |
| *H01M 50/20* | (2021.01) | |
| *B60K 6/28* | (2007.10) | |

(52) U.S. Cl.
CPC ........... *H01M 10/482* (2013.01); *B60L 50/64* (2019.02); *B60L 58/12* (2019.02); *G01R 31/371* (2019.01); *G01R 31/3835* (2019.01); *G01R 31/396* (2019.01); *H01M 10/425* (2013.01); *H01M 50/20* (2021.01); *B60K 6/28* (2013.01); *B60Y 2200/91* (2013.01); *B60Y 2200/92* (2013.01); *B60Y 2400/112* (2013.01); *H01M 2010/4278* (2013.01); *H01M 2220/20* (2013.01)

(58) Field of Classification Search
CPC .................................................. H01M 10/482
USPC ..................................................... 318/139, 34
See application file for complete search history.

(56) References Cited

U.S. PATENT DOCUMENTS

| | | | | |
|---|---|---|---|---|
| 6,480,003 | B1 * | 11/2002 | Ugaji ................ | H01M 10/4235 324/430 |
| 8,988,078 | B2 * | 3/2015 | Kiuchi .................. | H02J 7/0021 324/434 |
| 9,239,363 | B2 * | 1/2016 | Matsui .................. | H01M 10/48 |
| 10,572,325 | B2 * | 2/2020 | Yamazoe ................ | B60L 58/15 |

FOREIGN PATENT DOCUMENTS

JP        2018-061303 A       4/2018

* cited by examiner

*Primary Examiner* — David Luo
(74) *Attorney, Agent, or Firm* — Sughrue Mion, PLLC

(57) ABSTRACT

An assembled battery is constituted of a plurality of battery blocks connected in series, each battery block including a plurality of cells. SBMs are provided corresponding to the battery blocks, respectively. Each of the SBMs is configured to monitor at least one of a voltage of each cell included in a corresponding battery block, and a voltage of the corresponding battery block. A total voltage monitoring circuit is configured to monitor the total voltage of the assembled battery, separately from the SBMs.

7 Claims, 10 Drawing Sheets

BATTERY PACK, BATTERY MONITORING DEVICE, AND VEHICLE

This nonprovisional application is based on Japanese Patent Application No. 2018-219271 filed on Nov. 22, 2018 with the Japan Patent Office, the entire contents of which are hereby incorporated by reference.

BACKGROUND

Field

The present disclosure relates to a battery pack, a battery monitoring device, and a vehicle, particularly to a technique for monitoring a battery.

Description of the Background Art

Japanese Patent Laying-Open No. 2018-61303 describes a battery monitoring system to monitor an on-vehicle battery. In this battery monitoring system, a battery monitoring device is provided for each block including a plurality of cells. The monitoring result of each battery monitoring device is transmitted to a battery electronic control unit (ECU) via wireless communication.

In the above-mentioned battery monitoring system, if a failure occurs in a battery monitoring device (e.g., a failure in communication with the battery ECU), it becomes impossible to monitor the block corresponding to the battery monitoring device and to monitor the cells in the block. As a result, the state of the battery cannot be determined.

In preparation for such a failure, each battery monitoring device may be designed as a redundant system, or the communication path between each battery monitoring device and the battery ECU may be designed as a redundant system, for example. However, building a redundant system for each of a plurality of battery monitoring devices may involve considerable cost and a complicated system.

SUMMARY

The present disclosure has been made to solve such a problem. An object of the present disclosure is to provide a battery pack, a battery monitoring device, and a vehicle that can provide a backup with a simple configuration, even if monitoring of a block becomes impossible.

According to the present disclosure, a battery pack includes an assembled battery, a plurality of monitoring modules, and a total voltage monitoring device. The assembled battery includes a plurality of battery blocks connected in series, each of the plurality of battery blocks including a plurality of cells. The plurality of monitoring modules are provided corresponding to the plurality of battery blocks, and each monitoring module monitors at least one of a voltage of each cell included in a corresponding battery block, and a voltage of the corresponding battery block. The total voltage monitoring device monitors a total voltage of the assembled battery, separately from the plurality of monitoring modules.

In this battery pack, the assembled battery includes a plurality of battery blocks, and the plurality of monitoring modules provided corresponding to the plurality of battery blocks monitor the corresponding battery blocks. In such a battery pack, if a redundant system is built for each of the plurality of monitoring modules, the cost may increase and the system may become complicated. In the battery pack of the present disclosure, even if a monitoring module is failed and it becomes impossible to monitor the voltage of the battery block corresponding to the monitoring module and impossible to monitor the voltage of each cell included in the battery block, the voltage of the battery block corresponding to the failed monitoring module can be calculated based on the total voltage of the assembled battery monitored by the total voltage monitoring device and the voltages monitored by the normal monitoring modules. Therefore, the battery pack can provide a backup with a simple configuration without building a redundant system for each monitoring module in preparation for a failure in a monitoring module.

The battery pack may further include a control device. The control device receives a voltage monitoring result obtained by each monitoring module, and receives a monitoring result of the total voltage obtained by the total voltage monitoring device. The control device calculates, when any of the plurality of monitoring modules is failed, the voltage of a battery block corresponding to the failed monitoring module, based on the voltage monitoring result obtained by each of remaining monitoring modules and the monitoring result of the total voltage.

In this battery pack, the control device calculates the voltage of the battery block corresponding to the failed monitoring module. Therefore, the battery pack can provide a backup with a simple configuration without building a redundant system for each monitoring module in preparation for a failure in a monitoring module.

Each monitoring module may include a transmitting device that transmits the voltage monitoring result to the control device, the control device may include a receiving device that receives the voltage monitoring result from each monitoring module, and the transmitting device and the receiving device may communicate with each other wirelessly.

As described above, this battery pack includes a plurality of monitoring modules. If each of the plurality of monitoring modules is connected to the control device by wire, multiple wires may be required. By contrast, according to this battery pack, the transmitting device and the receiving device communicate with each other wirelessly, thus significantly reducing the number of wires.

The plurality of monitoring modules may constitute a daisy chain that performs bidirectional communication. In this case, each monitoring module transmits the voltage monitoring result to an adjacent monitoring module. Two monitoring modules at ends of the daisy chain among the plurality of monitoring modules communicate with the control device.

This configuration can reduce the number of wires between the plurality of monitoring modules and the control device.

Each monitoring module may include a cell monitoring device, a block monitoring device, and a transmitting device. The cell monitoring device monitors the voltage of each cell included in the corresponding battery block. The block monitoring device monitors the voltage of the corresponding battery block. The transmitting device transmits a monitoring result obtained by the cell monitoring device and a monitoring result obtained by the block monitoring device to the control device.

According to this battery pack, even if a cell monitoring device is failed, the voltage of the corresponding battery block can be monitored by the block monitoring device. Also, even if a block monitoring device is failed, the voltage of the corresponding battery block can be calculated by adding up the voltages of the cells monitored by the cell monitoring device.

According to the present disclosure, a vehicle includes the above-described battery pack, and an electric motor that generates a driving force for travel by receiving electric power from the battery pack.

According to the present disclosure, a battery monitoring device monitors an assembled battery constituted of a plurality of battery blocks connected in series, each of the plurality of battery blocks including a plurality of cells. The battery monitoring device includes a plurality of monitoring modules, a voltage sensor, and a control device. The plurality of monitoring modules are provided corresponding to the plurality of battery blocks, and each monitoring module monitors at least one of a voltage of each cell included in a corresponding battery block, and a voltage of the corresponding battery block. The voltage sensor monitors a voltage of the assembled battery in an electrical device that receives electric power from the assembled battery. The control device receives a voltage monitoring result obtained by each monitoring module, and receives a monitoring result of the voltage of the assembled battery obtained by the voltage sensor. The control device calculates, when any of the plurality of monitoring modules is failed, the voltage of a battery block corresponding to the failed monitoring module, based on the voltage monitoring result obtained by each of remaining monitoring modules and the monitoring result of the voltage of the assembled battery.

In this battery monitoring device, the voltage (total voltage) of the assembled battery is monitored using the voltage sensor provided in an electrical device that receives electric power from the assembled battery. Accordingly, the voltage of the battery block corresponding to the failed monitoring module can be calculated by the control device, without additionally providing a total voltage monitoring device in the battery pack. Therefore, the battery monitoring device can provide a backup with a simple configuration without building a redundant system for each monitoring module in preparation for a failure in a monitoring module.

According to the present disclosure, a vehicle includes an assembled battery that includes a plurality of battery blocks connected in series, each of the plurality of battery blocks including a plurality of cells; the above-described battery monitoring device; and an electric motor that generates a driving force for travel by receiving electric power from the assembled battery.

The foregoing and other objects, features, aspects and advantages of the present disclosure will become more apparent from the following detailed description when taken in conjunction with the accompanying drawings.

DESCRIPTION OF THE PREFERRED EMBODIMENTS

Figure 1:
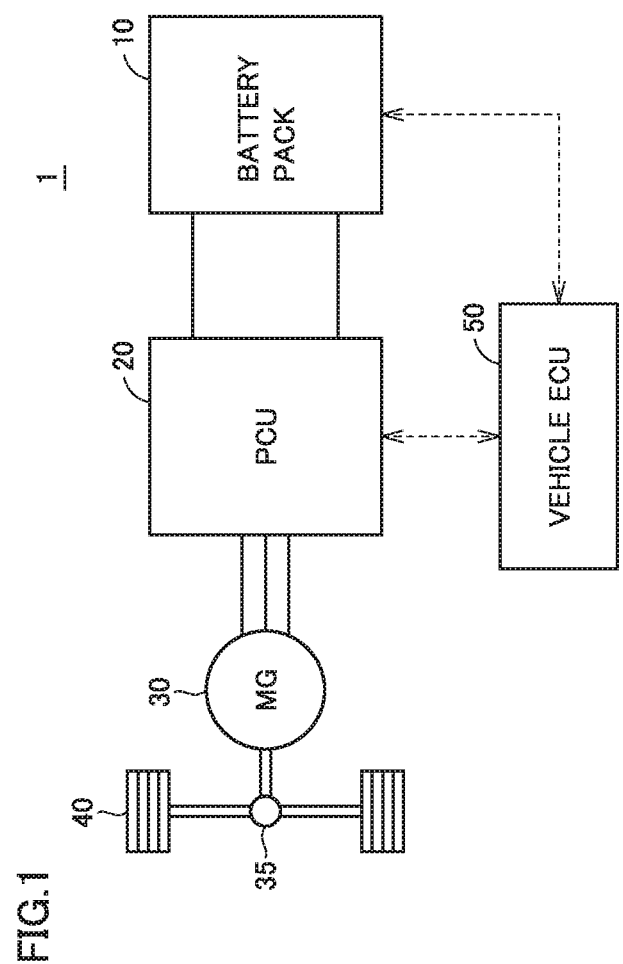
FIG. 1 is a diagram schematically showing a configuration of a vehicle having a battery pack thereon according to embodiment 1.

Hereinafter embodiments of the present disclosure are described in detail with reference to the drawings. In the drawings, identical or corresponding parts are denoted by identical reference signs, and redundant description is not repeated. Although the following embodiments describe on-vehicle battery packs, a battery pack according to the present disclosure is also applicable to purposes other than vehicles.

Embodiment 1

<General Configuration of Vehicle>

FIG. 1 is a diagram schematically showing a configuration of a vehicle 1 having a battery pack thereon according to embodiment 1. With reference to FIG. 1, vehicle 1 includes a battery pack 10, a power control unit (hereinafter referred to as a "PCU") 20, a motor generator (hereinafter referred to as an "MG") 30, a drive-train gear 35, a driving wheel 40, and a vehicle ECU 50.

Battery pack 10 is mounted on vehicle 1 as a power source (driving power source) of vehicle 1. That is, vehicle 1 is an electric vehicle or a hybrid vehicle that travels using electric power stored in battery pack 10. The hybrid vehicle is a vehicle including an engine or fuel cell (not shown) as well as battery pack 10, as a power source of vehicle 1. The electric vehicle is a vehicle including only battery pack 10 as a power source of vehicle 1.

Battery pack 10 includes an assembled battery constituted of multiple cells (secondary cells). Specifically, a plurality of cells are connected in series and/or parallel to constitute a battery block (also referred to as a battery stack), and a plurality of battery blocks are connected in series to constitute an assembled battery. Each cell may be a lithium-ion secondary cell, a nickel-metal hydride secondary cell or the like. The lithium-ion secondary cell is a secondary cell with lithium serving as a charge carrier. Examples of the lithium-ion secondary cell include not only a common lithium-ion secondary cell with a liquid electrolyte, but also a so-called all-solid cell with a solid electrolyte.

Battery pack 10 stores electric power in its assembled battery for driving MG 30 and can supply the electric power to MG 30 through PCU 20. Also, battery pack 10 is charged with electric power generated by MG 30 through PCU 20 when MG 30 generates regenerative power (e.g., when the vehicle is braked). Although not shown, battery pack 10 can be charged from a power supply outside of the vehicle, via a charging device for charging battery pack 10.

Battery pack 10 includes a monitoring means to monitor the assembled battery, and a control means (battery ECU) to execute a prescribed process based on a monitoring result of the monitoring means (these means are not shown in FIG. 1). The configurations of the monitoring means and the control means are described in detail on and after FIG. 2.

PCU 20 performs bidirectional power conversion between battery pack 10 and MG 30 in accordance with the control signal from vehicle ECU 50. For example, PCU 20 includes an inverter to drive MG 30, and a converter to boost a DC voltage supplied to the inverter into a voltage equal to or higher than the output voltage of battery pack 10.

MG 30 is typically an AC dynamo-electric machine, such as a three-phase AC synchronous motor having a rotor with an embedded permanent magnet. MG 30 is driven by PCU 20 to generate a rotational driving force, and the driving force generated by MG 30 is transmitted to driving wheel 40 through drive-train gear 35. On the other hand, when vehicle 1 is braked, MG 30 operates as an electrical power generator to generate regenerative power. The electric power generated by MG 30 is supplied to battery pack 10 through PCU 20 and stored in the assembled battery in battery pack 10.

Vehicle ECU 50 includes a CPU (Central Processing Unit), a memory (ROM (Read Only Memory) and RAM (Random Access Memory)), and an input/output port for inputting and outputting various types of signals, none of which is shown. The CPU expands a program stored in the ROM into the RAM for execution. The program stored in the ROM describes a process of vehicle ECU 50. As an example main process of vehicle ECU 50, vehicle ECU 50 controls PCU 20 based on the information on the assembled battery (e.g., the voltage, current, SOC (State Of Charge)) received from battery pack 10, thereby controlling the driving of MG 30 and the charging and discharging of battery pack 10.

<Configuration of Battery Pack 10>

There has been a growing demand for increases in capacity and output of battery packs, and the number of cells constituting each battery pack has also been increased. Accordingly, it has become difficult to monitor all the cells with one monitoring device. Such a battery pack 10 includes an assembled battery constituted of a plurality of battery blocks. For the plurality of battery blocks, a plurality of monitoring modules are provided. Each monitoring module monitors a corresponding one of the battery blocks.

In such monitoring for each battery block, if a failure occurs in a monitoring module for a battery block, the battery block cannot be monitored. This may make it impossible to determine the state of the battery.

In preparation for such a failure, a redundant system may be built for each monitoring module, for example. However, building a redundant system for each of a plurality of monitoring modules may involve considerable cost and a complicated monitoring system.

To address this problem, in battery pack 10 according to embodiment 1, the total voltage of the assembled battery is monitored, separately from the monitoring by a plurality of monitoring modules. The total voltage refers to the voltage of the overall assembled battery. Thus, even if a monitoring module is failed and it becomes impossible to monitor the voltage of the battery block corresponding to the monitoring module (hereinafter also referred to as a "block voltage") and impossible to monitor the voltage of each cell included in the battery block, the block voltage corresponding to the failed monitoring module can be calculated based on the monitored total voltage of the assembled battery and based on the voltages monitored by the normal monitoring modules. Therefore, this battery pack 10 can provide a backup with a simple configuration without building a redundant system for each monitoring module in preparation for a failure in a monitoring module. Hereinafter, the configuration of battery pack 10 is described in detail.

Figure 2:
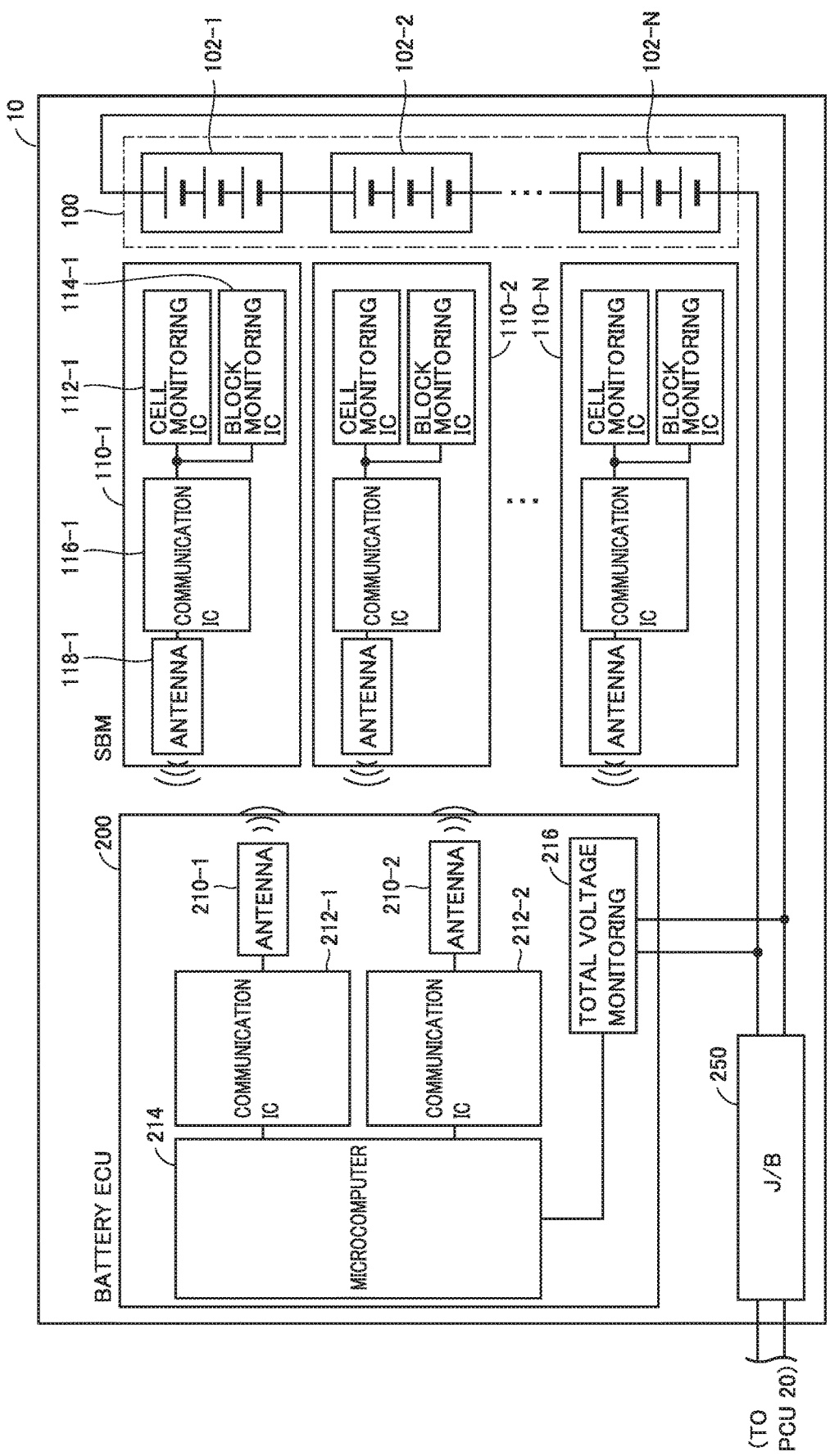
FIG. 2 is a detailed configuration diagram of the battery pack shown in FIG. 1.

FIG. 2 is a detailed configuration diagram of battery pack 10 shown in FIG. 1. With reference to FIG. 2, battery pack 10 includes an assembled battery 100 and a junction box (hereinafter referred to as a "J/B") 250. Assembled battery 100 is constituted of a plurality of battery blocks 102-1 to 102-N connected in series. Each of battery blocks 102-1 to 102-N includes a plurality of cells connected in series and/or parallel.

J/B 250 is provided on power lines connected to the positive electrode and the negative electrode of assembled battery 100. J/B 250 includes a system main relay (SMR) (not shown) with which to switch between electrical connection and disconnection between assembled battery 100 and PCU 20 (FIG. 1).

Battery pack 10 further includes a plurality of monitoring modules 110-1 to 110-N and a battery ECU 200. Hereinafter, each of monitoring modules 110-1 to 110-N is referred to as a satellite battery module (SBM).

SBMs 110-1 to 110-N are provided corresponding to battery blocks 102-1 to 102-N, respectively. SBM 110-1 includes a cell monitoring IC 112-1, a block monitoring IC 114-1, a communication IC 116-1, and an antenna 118-1. These devices are arranged on a substrate appropriately to constitute SBM 110-1. Cell monitoring IC 112-1 monitors the voltage of each cell in battery block 102-1. Block monitoring IC 114-1 detects the voltage of battery block 102-1 (block voltage).

Figure 3:
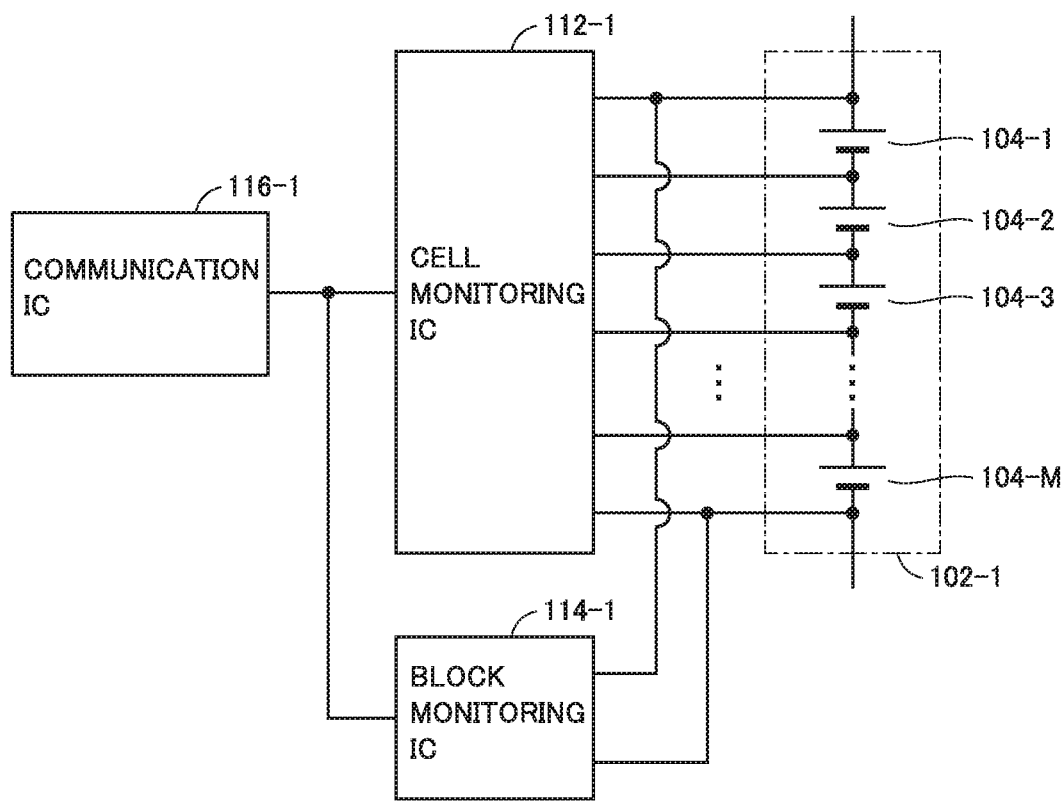
FIG. 3 is a diagram showing an example configuration of a voltage monitoring circuit for a battery block, with a cell monitoring IC and a block monitoring IC.

FIG. 3 is a diagram showing an example configuration of a voltage monitoring circuit for battery block 102-1, with cell monitoring IC 112-1 and block monitoring IC 114-1. With reference to FIG. 3, cell monitoring IC 112-1 receives the voltage of each of cells 104-1 to 104-M connected in series. Each of cells 104-1 to 104-M may be constituted of a plurality of cells connected in parallel. Cell monitoring IC 112-1 includes an A/D converter (not shown) with which to convert the received voltage of each cell into a digital signal and output it to communication IC 116-1. Block monitoring IC 114-1 receives the block voltage of battery block 102-1. Block monitoring IC 114-1 includes an A/D converter (not shown) with which to convert the received voltage of battery block 102-1 into a digital signal and output it to communication IC 116-1.

Referring back to FIG. 2, communication IC 116-1 receives, from cell monitoring IC 112-1, the voltage monitoring result of each cell of battery block 102-1 obtained by cell monitoring IC 112-1. Communication IC 116-1 also receives, from block monitoring IC 114-1, the voltage monitoring result of battery block 102-1 obtained by block monitoring IC 114-1. Communication IC 116-1 wirelessly transmits the voltage monitoring results of battery block 102-1 received from cell monitoring IC 112-1 and block monitoring IC 114-1, to battery ECU 200 via antenna 118-1.

The other SBMs 110-2 to 110-N have the same configuration as SBM 110-1. Specifically, in each of SBMs 110-2 to 110-N, the voltage of each cell and the block voltage of the corresponding battery block are monitored by the cell monitoring IC and the block monitoring IC, and the voltage monitoring results are wirelessly transmitted to battery ECU 200.

Battery ECU 200 includes antennas 210-1, 210-2, communication ICs 212-1, 212-2, a microcomputer 214, and a total voltage monitoring circuit 216. Communication IC 212-1 receives a wireless signal output from each of SBMs 110-1 to 110-N via antenna 210-1. Also, communication IC 212-1 outputs, to microcomputer 214, the signal received from each of SBMs 110-1 to 110-N.

Antenna 210-2 and communication IC 212-2 are provided for backups for antenna 210-1 and communication IC 212-1. In battery ECU 200, the system of reception from SBMs 110-1 to 110-N is redundant so as to avoid a situation where microcomputer 214 cannot receive any of the monitoring results of SBMs 110-1 to 110-N due to a failure in any of antenna 210-1 and communication IC 212-1.

Total voltage monitoring circuit 216 monitors the total voltage of assembled battery 100 (the voltage of the overall assembled battery 100). In the example shown in FIG. 2, total voltage monitoring circuit 216 receives the voltage of the paired power lines connected to the positive electrode and the negative electrode of assembled battery 100. For example, total voltage monitoring circuit 216 includes an A/D converter (not shown) with which to convert the received voltage into a digital signal and output it to microcomputer 214. Total voltage monitoring circuit 216 may receive the voltage of the paired power lines branched in J/B 250, or may be connected to the paired power lines on the PCU 20 side relative to J/B 250.

Microcomputer 214 includes a CPU, a memory, and a signal input/output port, none of which is shown. Microcomputer 214 receives a signal received from each of SBMs 110-1 to 110-N via antenna 210-1 and communication IC 212-1 (or antenna 210-2 and communication IC 212-2). Specifically, microcomputer 214 receives the voltage of each cell included in each battery block monitored by each of SBMs 110-1 to 110-N, and receives the block voltage of the corresponding battery block. Also, microcomputer 214 is connected to total voltage monitoring circuit 216 from which to receive a signal representing the total voltage of assembled battery 100.

Further, microcomputer 214 regularly executes self-diagnosis for battery ECU 200 and SBMs 110-1 to 110-N. In the self-diagnosis, devices are checked for proper operation, the devices including antenna 210-1 and communication IC 212-1, antenna 210-2 and communication IC 212-2, total voltage monitoring circuit 216, and SBMs 110-1 to 110-N. Specifically, in checking each of SBMs 110-1 to 110-N for proper operation, its antenna, communication IC, cell monitoring IC, and block monitoring IC are checked.

As the result of the self-diagnosis, if determining that there is an SBM that cannot monitor any of the voltage of each cell and the block voltage of the corresponding battery block (hereinafter referred to as a "failed SBM"), microcomputer 214 calculates the block voltage of the battery block corresponding to the failed SBM, based on the voltage monitoring results obtained by the SBMs except the failed SBM, and based on the monitoring result of the total voltage of assembled battery 100 obtained by total voltage monitoring circuit 216. Thus, the voltage of the battery block corresponding to the failed SBM can be monitored.

Examples of failures that cause an SBM to fail to monitor any of the voltage of each cell and the block voltage of the corresponding battery block include a failure in the communication IC or the antenna, a disconnection between the communication IC and the antenna, and a simultaneous failure in the cell monitoring IC and the block monitoring IC.

The block voltage of the battery block corresponding to the failed SBM can be calculated by subtracting the sum of the block voltages monitored by the SBMs other than the failed SBM, from the total voltage of assembled battery 100 monitored by total voltage monitoring circuit 216. The block voltage may be a voltage monitored by the block monitoring IC of the corresponding SBM, or may be the sum of the voltages of the cells monitored by the cell monitoring IC.

Figure 4:
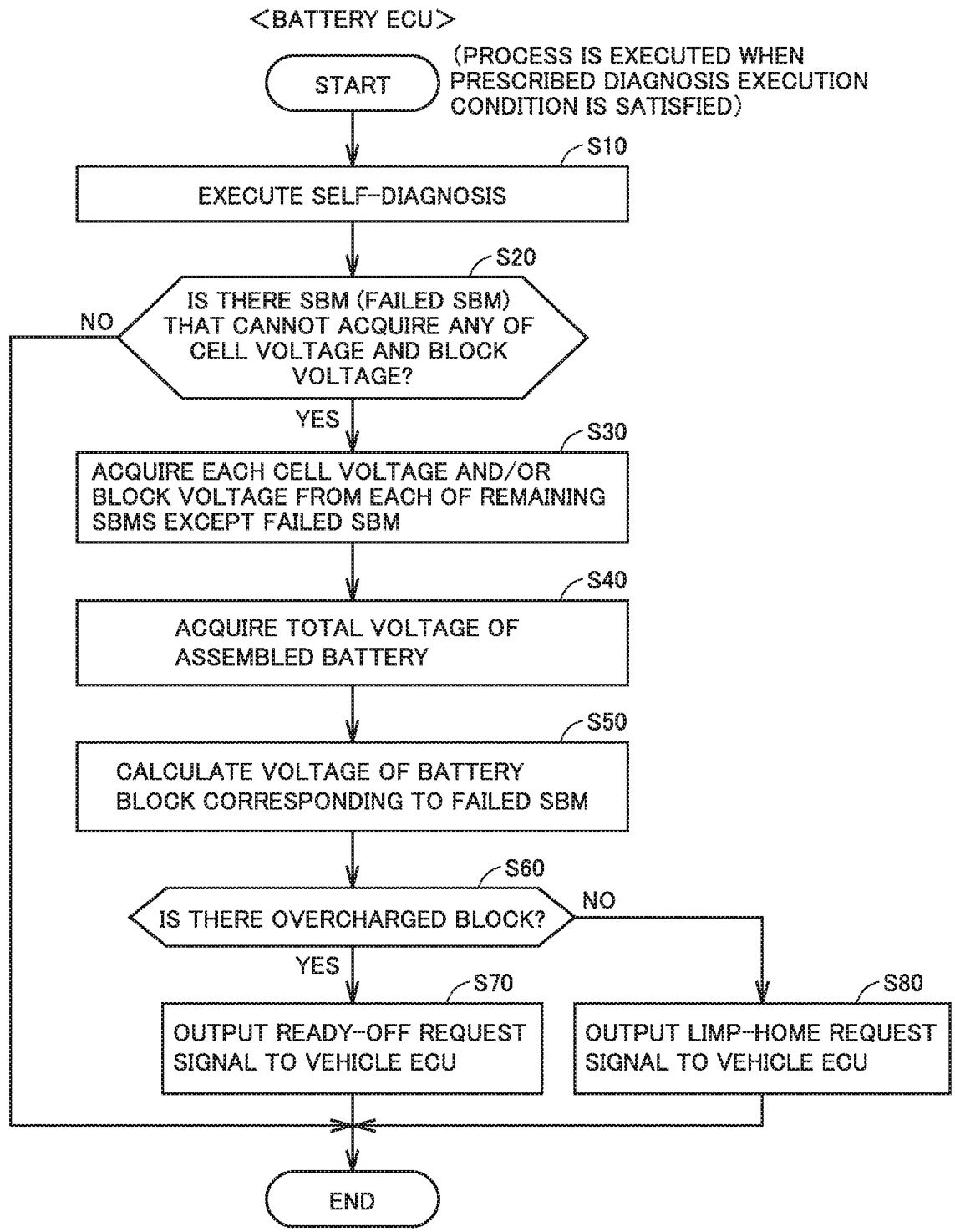
FIG. 4 is a flowchart showing an example process to be executed by a microcomputer of a battery ECU.

FIG. 4 is a flowchart showing an example process to be executed by microcomputer 214 of battery ECU 200. A series of processes shown in this flowchart is executed when a prescribed self-diagnosis execution condition is satisfied. For example, the self-diagnosis execution condition may be satisfied every time a prescribed period of time has elapsed while battery ECU 200 is running.

With reference to FIG. 4, first, microcomputer 214 of battery ECU 200 executes prescribed self-diagnosis (step S10). As described above, in the self-diagnosis, various devices including SBMs 110-1 to 110-N are checked for proper operation.

Based on the result of the self-diagnosis, microcomputer 214 determines whether or not there is an SBM (failed SBM) that cannot monitor any of the voltage of each cell (cell voltage) and the voltage of its battery block (block voltage) (step S20). Microcomputer 214 determines that there is a failed SBM if the self-diagnosis has detected a failure in the communication IC or the antenna, a disconnection between the communication IC and the antenna, or a simultaneous failure in the cell monitoring IC and the block monitoring IC, for example.

If determining at step S20 that there is a failed SBM (YES at step S20), microcomputer 214 acquires the monitoring result of the voltage of each cell and/or the block voltage transmitted from each of the remaining SBMs except the failed SBM (step S30). Further, microcomputer 214 acquires the monitoring result of the total voltage of assembled battery 100 from total voltage monitoring circuit 216 (step S40).

Then, microcomputer 214 calculates the voltage of the battery block corresponding to the failed SBM, based on the voltage monitoring result of the SBMs other than the failed SBM acquired at step S30, and based on the monitoring result of the total voltage of assembled battery 100 acquired at step S40 (step S50). Specifically, microcomputer 214 calculates the block voltage of the battery block corresponding to the failed SBM by subtracting the sum of the block voltages monitored by the SBMs other than the failed SBM, from the total voltage of assembled battery 100. The block voltages monitored by the SBMs other than the failed SBM may be the monitoring results of the block voltages acquired from the respective SBMs, or may be calculated by adding up the voltages of the cells acquired from each SBM.

Then, microcomputer 214 determines, for each battery block, whether or not there is an overcharged battery block (regardless of the presence or absence of a failure in the corresponding SBM) (step S60). Whether or not a battery block is overcharged is determined based on whether or not its block voltage exceeds a prescribed upper limit.

If determining that there is an overcharged battery block (YES at step S60), microcomputer 214 outputs, to vehicle ECU 50 (FIG. 1), a Ready-OFF request signal that requests the stop of the vehicle system for stopping the travel of vehicle 1 (step S70). Thus, vehicle ECU 50 executes a process for stopping vehicle 1, so that vehicle 1 is in a Ready-OFF state (stop state).

On the other hand, If determining at step S60 that there is no overcharged battery block (NO at step S60), microcomputer 214 outputs, to vehicle ECU 50, a limp-home request signal that requests a limp-home travel for setting the travel mode of vehicle 1 to a limp-home mode (step S80). The limp-home travel refers to a travel in which the output of vehicle 1 (the output of battery pack 10) is restricted to a prescribed period of time (e.g., 30 minutes), for example. The limp-home travel allows vehicle 1 to travel to a nearby dealer or the like with a restricted output, since step S20 has detected a failed SBM, though without an overcharged battery block.

If determining at step S20 that there is no failed SBM (NO at step S20), microcomputer 214 advances the process to the end without executing a series of processes after step S20.

If determining that there is no failed SBM, microcomputer 214 may also determine whether or not there is an overcharged battery block based on the cell voltage and/or the block voltage acquired from each SBM, although not shown. If determining that there is an overcharged battery block, microcomputer 214 may output the Ready-OFF request signal or the limp-home request signal to vehicle ECU 50. If there is no overcharged battery block, it means no abnormality detected and thus the limp-home request signal is not output to vehicle ECU 50.

As described above, in embodiment 1, even if an SBM is failed and it becomes impossible to monitor the block voltage and the voltage of each cell of the battery block corresponding to the SBM, the block voltage of the battery block corresponding to the failed SBM can be calculated based on the total voltage of assembled battery 100 monitored by total voltage monitoring circuit 216 and based on the block voltages monitored by the normal SBMs. Thus, embodiment 1 can provide a backup with a simple configuration without building a redundant system for each SBM in preparation for a failure in an SBM.

Further, in embodiment 1, each of SBMs 110-1 to 110-N and battery ECU 200 wirelessly communicate with each other. This can significantly reduce the number of wires in battery pack 10.

Further, in embodiment 1, each of SBMs 110-1 to 110-N includes a cell monitoring IC and a block monitoring IC. Accordingly, even if a cell monitoring IC is failed, the block voltage of the corresponding battery block can be monitored by the block monitoring IC. Also, even if a block monitoring IC is failed, the block voltage of the corresponding battery block can be calculated by adding up the voltages of the cells monitored by the cell monitoring IC. Thus, embodiment 1 can provide battery monitoring with a high level of safety.

Embodiment 2

In embodiment 1, total voltage monitoring circuit 216 to monitor the total voltage of assembled battery 100 is included in battery pack 10. By contrast, in embodiment 2, the total voltage of assembled battery 100 is monitored using a voltage sensor provided in PCU 20 which receives electric power from the battery pack.

Figure 5:
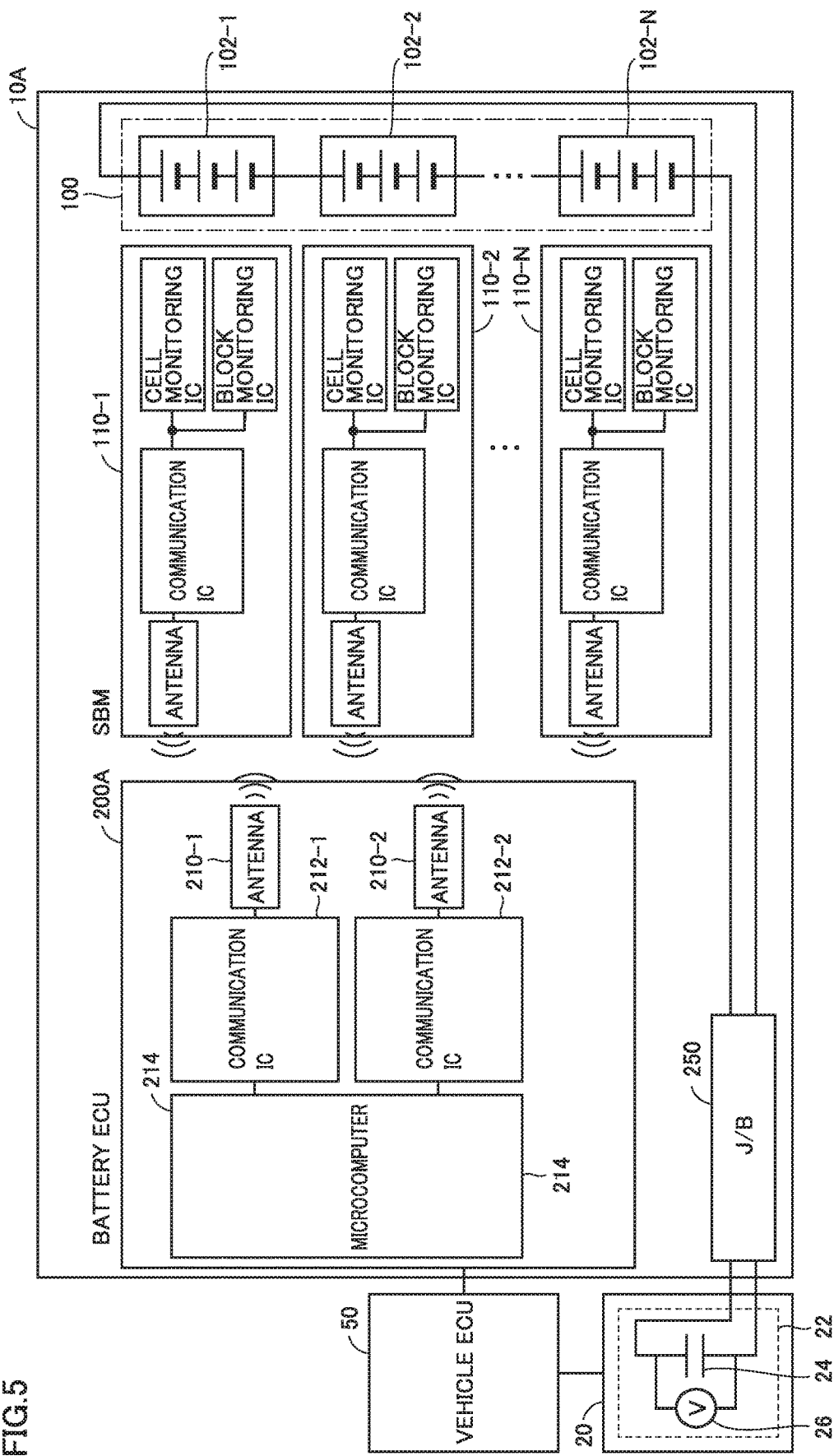
FIG. 5 is a configuration diagram of a battery system to which a battery monitoring device according to embodiment 2 is applicable.

FIG. 5 is a configuration diagram of a battery system to which a battery monitoring device according to embodiment 2 is applicable. With reference to FIG. 5, in this battery system, battery pack 10A has the same configuration as battery pack 10 shown in FIG. 2, except that it includes battery ECU 200A instead of battery ECU 200. Battery ECU 200A has the same configuration as battery ECU 200, but without total voltage monitoring circuit 216.

PCU 20 includes a voltage monitoring circuit 22 to monitor the voltage output from assembled battery 100 of battery pack 10A. Voltage monitoring circuit 22 includes a capacitor 24 and a voltage sensor 26. Capacitor 24 is connected between the paired power lines connected to the positive electrode and the negative electrode of assembled battery 100 via J/B 250. That is, the total voltage of assembled battery 100 is applied across capacitor 24.

Voltage sensor 26 detects the voltage across capacitor 24, i.e., the total voltage of assembled battery 100, and outputs the detection value to vehicle ECU 50. When vehicle ECU 50 receives the voltage detection value from voltage sensor 26, vehicle ECU 50 transmits the detection value to battery ECU 200A of battery pack 10A. Thus, the total voltage of assembled battery 100 is detected using voltage sensor 26 of PCU 20, and the detection value is transmitted to battery ECU 200A of battery pack 10A through vehicle ECU 50.

Figure 6:
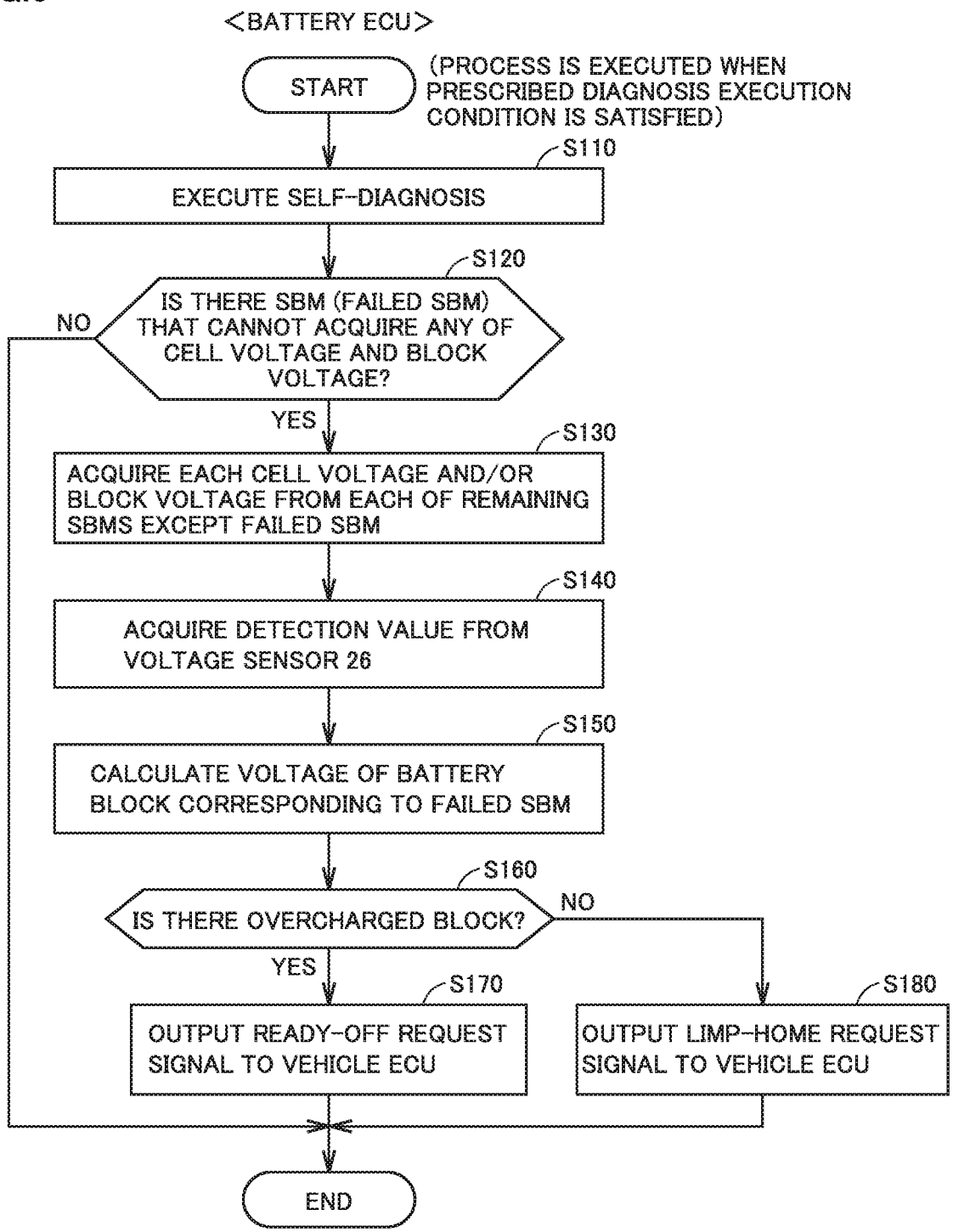
FIG. 6 is a flowchart showing an example process to be executed by a microcomputer of a battery ECU in embodiment 2.

FIG. 6 is a flowchart showing an example process to be executed by microcomputer 214 of battery ECU 200A in embodiment 2. This flowchart corresponds to the flowchart shown in FIG. 4 in embodiment 1. A series of processes shown in this flowchart is also executed when a prescribed self-diagnosis execution condition is satisfied.

With reference to FIG. 6, the processes of S110 to S130 and S150 to S180, other than step S140, are the same as the processes of S10 to S30 and S50 to S80 shown in FIG. 4. If microcomputer 214 determines at step S120 that there is a failed SBM (YES at step S120) and acquires at step S130 the monitoring result of the voltage of each cell and/or the block voltage transmitted from each of the remaining SBMs except the failed SBM, then microcomputer 214 acquires the voltage detection value from voltage sensor 26 of PCU 20 via vehicle ECU 50 (step S140). As described above, the voltage detected by voltage sensor 26 is equivalent to the total voltage of assembled battery 100.

Then, microcomputer 214 advances the process to step S150 where microcomputer 214 calculates the voltage of the battery block corresponding to the failed SBM, based on the voltage monitoring result of the SBMs other than the failed SBM acquired at step S130, and based on the detection value of voltage sensor 26 (the monitoring result of the voltage of assembled battery 100) acquired at step S140. Specifically, microcomputer 214 calculates the block voltage of the battery block corresponding to the failed SBM by subtracting the sum of the block voltages monitored by the SBMs other than the failed SBM, from the detection value of voltage sensor 26 (the total voltage of assembled battery 100). The process after this step is as described above with reference to FIG. 4.

As described above, in embodiment 2, the voltage (total voltage) of assembled battery 100 is monitored using voltage sensor 26 provided in PCU 20. Accordingly, the voltage of the battery block corresponding to the failed SBM can be calculated without additionally providing a total voltage monitoring circuit in battery pack 10A. Thus, embodiment 2 can provide a backup with a simple configuration without building a redundant system for each SBM in preparation for a failure in an SBM.

Embodiment 3

In embodiment 1, the communication between each of SBMs 110-1 to 110-N and battery ECU 200 is performed wirelessly. By contrast, in embodiment 3, the communication is performed by wire. Further, in embodiment 3, daisy-chain communication is employed so as to reduce the number of wires between SBMs 110-1 to 110-N and battery ECU 200.

Figure 7:
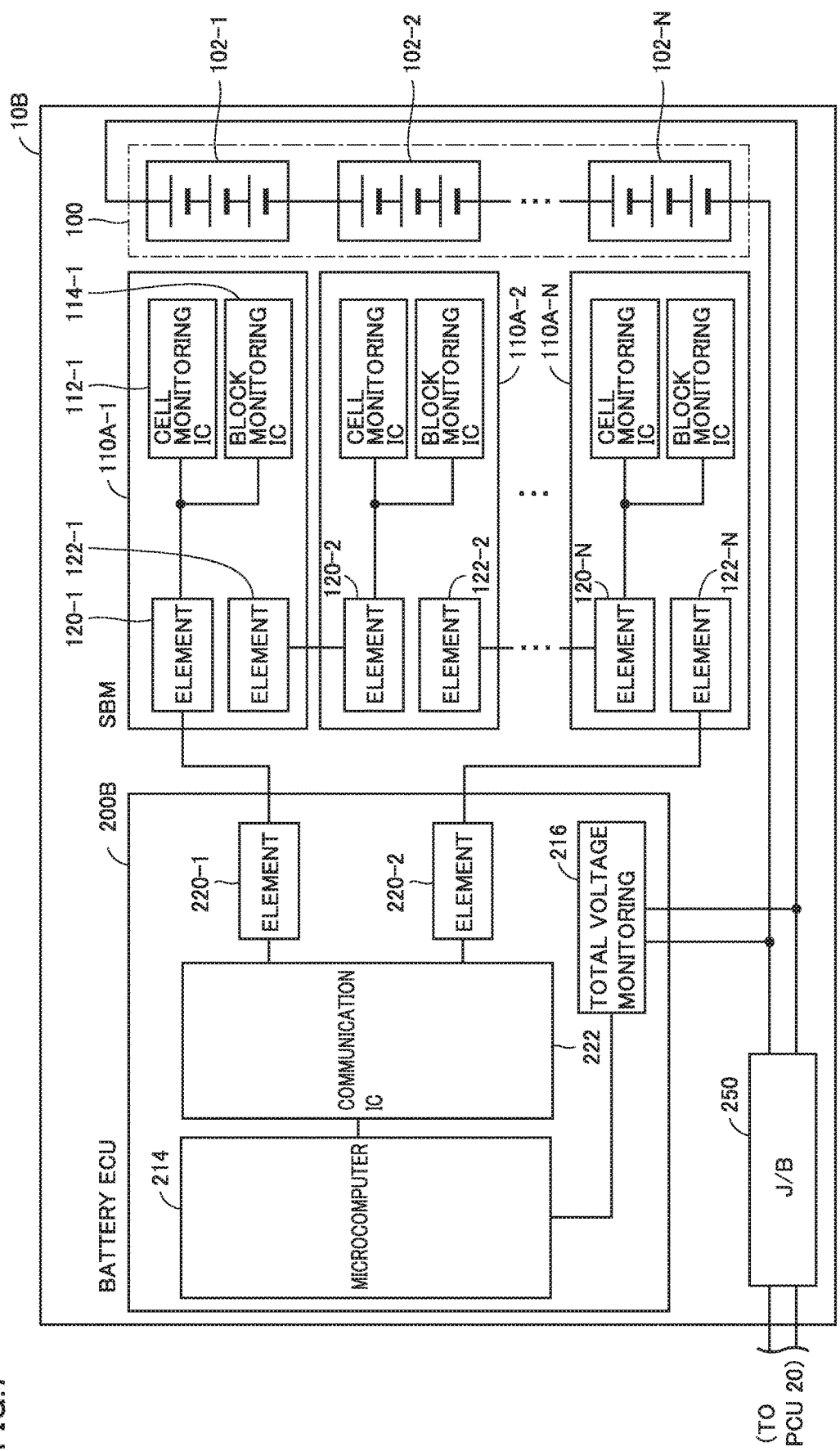
FIG. 7 is a configuration diagram of a battery pack according to embodiment 3.

FIG. 7 is a configuration diagram of a battery pack according to embodiment 3. With reference to FIG. 7, battery pack 10B includes assembled battery 100, a plurality of SBMs 110A-1 to 110A-N, battery ECU 200B, and J/B 250.

SBMs 110A-1 to 110A-N are provided corresponding to battery blocks 102-1 to 102-N, respectively. SBM 110A-1 includes cell monitoring IC 112-1, block monitoring IC 114-1, and elements 120-1, 122-1. These devices are arranged on a substrate appropriately to constitute SBM 110A-1.

Element 120-1 is an insulating element for communicating with battery ECU 200B by wire while electrically insulating battery ECU 200B from SBM 110A-1. SBM 110A-1 is a high-voltage substrate using the corresponding battery block 102-1 as an operation power supply, whereas battery ECU 200B is a low-voltage substrate using an auxiliary machinery system (not shown) as an operation power supply, and element 120-1 electrically insulates SBM 110A-1 and battery ECU 200B from each other. Element 120-1 is, for example, a pulse transformer, a photocoupler or the like.

Element 122-1 is an insulating element for communicating with adjacent SBM 110A-2 while electrically insulating SBM 110A-2 from SBM 110A-1. SBM 110A-1 and SBM 110A-2 are different substrates, and element 122-1 electrically insulates SBM 110A-1 and SBM 110A-2 from each other. Element 122-1 is, for example, a pulse transformer, a photocoupler or the like.

SBM 110A-2 includes a cell monitoring IC, a block monitoring IC, and elements 120-2, 122-2. Element 120-2 is an insulating element for communicating with adjacent SBM 110A-1 while electrically insulating SBM 110A-1 from SBM 110A-2. Element 122-2 is an insulating element for communicating with adjacent SBM 110A-3 (not shown) while electrically insulating SBM 110A-3 from SBM 110A-2. Each of elements 120-2, 122-2 is, for example, a pulse transformer, a photocoupler or the like.

The other SBMs 110A-3 to 110A-N have the same configuration as SBMs 110A-1, 110A-2. Element 122-N of SBM 110A-N is an insulating element for communicating with battery ECU 200B by wire while electrically insulating battery ECU 200B from SBM 110A-N.

Battery ECU 200B has the same configuration as battery ECU 200 shown in FIG. 2, except that it includes elements 220-1, 220-2 and communication IC 222, instead of antennas 210-1, 210-2 and communication ICs 212-1, 212-2.

Element 220-1 is an insulating element for communicating with SBM 110A-1 by wire while electrically insulating SBM 110A-1 from battery ECU 200B. Element 220-2 is an insulating element for communicating with SBM 110A-N by wire while electrically insulating SBM 110A-N from battery ECU 200B. Each of elements 220-1, 220-2 is, for example, a pulse transformer, a photocoupler or the like.

In this way, SBMs 110A-1 to 110A-N are sequentially connected, and SBMs 110A-1, 110A-N at the ends are connected to battery ECU 200B. Thus, SBMs 110A-1 to 110A-N constitute a so-called daisy chain, and the voltage monitoring results obtained by SBMs 110A-1 to 110A-N are transmitted to battery ECU 200B through the daisy chain.

Communication IC 222 receives the voltage monitoring result output from each of SBMs 110A-1 to 110A-N, from element 220-1 or element 220-2 through the daisy chain. Also, communication IC 222 outputs, to microcomputer 214, the received voltage monitoring result of each of battery blocks 102-1 to 102-N. The daisy chain constituted of SBMs 110A-1 to 110A-N are configured to perform bidirectional communication, and communication IC 222 can receive the voltage monitoring result obtained by each of SBMs 110A-1 to 110A-N from both elements 220-1 and 220-2. Owing to such bidirectionality, even if any of SBMs 110A-1 to 110A-N is failed, the voltage monitoring results obtained by the remaining SBMs can be received from any of elements 220-1, 220-2.

The flowchart of the process to be executed by microcomputer 214 of battery ECU 200B is the same as the flowchart in embodiment 1 shown in FIG. 4.

As described above, in embodiment 3, SBMs 110A-1 to 110A-N constitute a daisy chain that can perform bidirectional communication. Thus, according to embodiment 3, the number of wires between SBMs 110A-1 to 110A-N and battery ECU 200B can be reduced.

Embodiment 4

In embodiment 4, the total voltage of assembled battery 100 is monitored using voltage sensor 26 provided in PCU 20 which receives electric power from the battery pack, instead of total voltage monitoring circuit 216 provided in battery pack 10B in embodiment 3. Embodiment 4 in relation to embodiment 3 corresponds to embodiment 2 in relation to embodiment 1.

Figure 8:
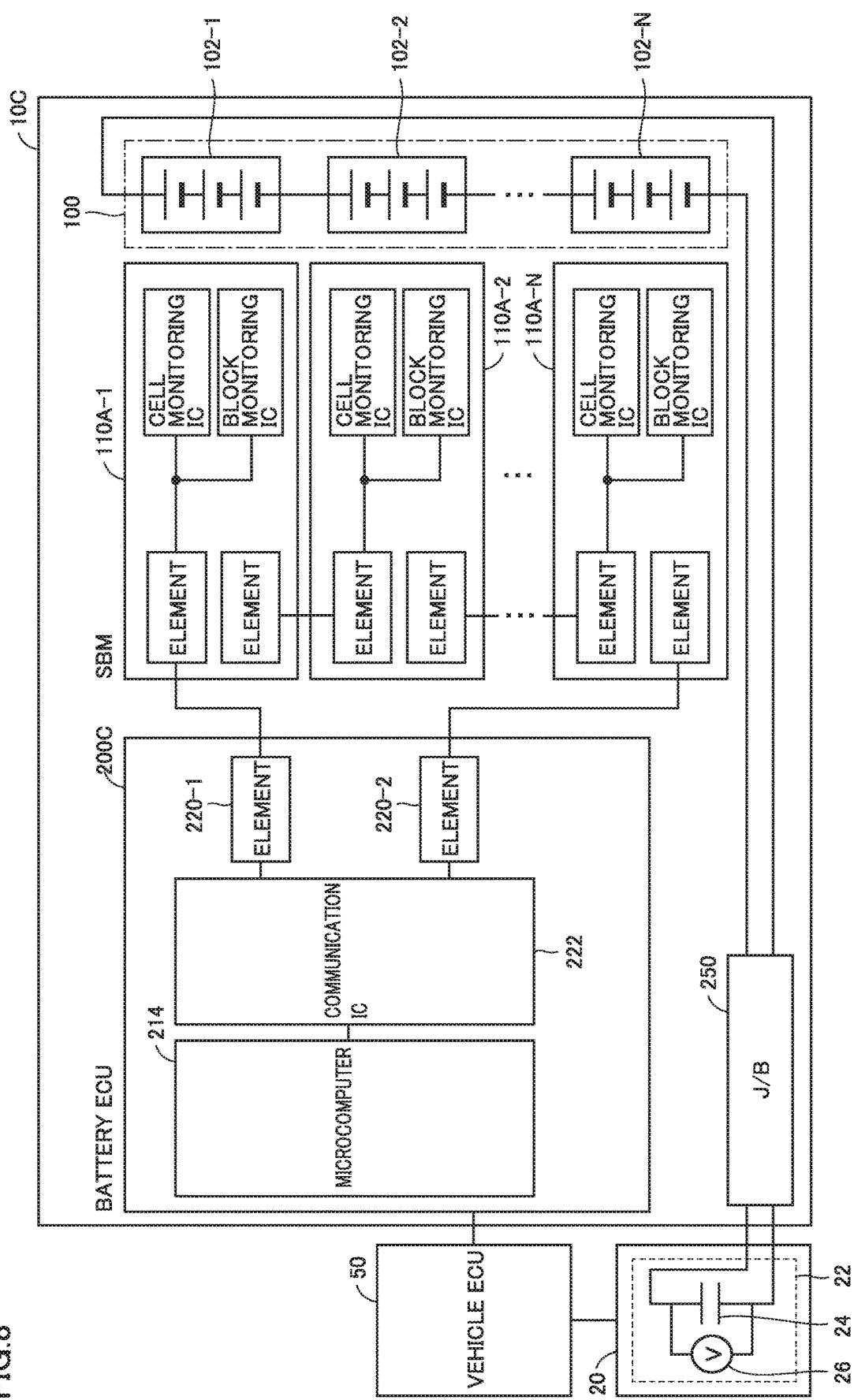
FIG. 8 is a configuration diagram of a battery system to which a battery monitoring device according to embodiment 4 is applicable.

FIG. 8 is a configuration diagram of a battery system to which a battery monitoring device according to embodiment 4 is applicable. With reference to FIG. 8, in this battery system, battery pack 10C has the same configuration as battery pack 10B in embodiment 3 shown in FIG. 7, except that it includes battery ECU 200C instead of battery ECU 200B. Battery ECU 200C has the same configuration as battery ECU 200B, but without total voltage monitoring circuit 216.

PCU 20 includes voltage monitoring circuit 22 to monitor the voltage output from assembled battery 100 of battery pack 10C. The configuration of PCU 20 is as described above with reference to FIG. 5. Specifically, voltage sensor 26 detects the voltage across capacitor 24, i.e., the total voltage of assembled battery 100, and outputs the detection value to vehicle ECU 50. When vehicle ECU 50 receives the voltage detection value from voltage sensor 26, vehicle ECU 50 transmits the detection value to battery ECU 200C of battery pack 10C. Thus, the total voltage of assembled battery 100 is detected using voltage sensor 26 of PCU 20, and the detection value is transmitted to battery ECU 200C of battery pack 10C through vehicle ECU 50.

The flowchart of the process to be executed by microcomputer 214 of battery ECU 200C is the same as the flowchart in embodiment 2 shown in FIG. 6.

As described above, according to embodiment 4, SBMs 110A-1 to 110A-N are daisy-chain connected, and accordingly the number of wires can be reduced. Further, the voltage (total voltage) of assembled battery 100 is monitored using voltage sensor 26 provided in PCU 20. Accordingly, the voltage of the battery block corresponding to a failed SBM can be calculated without additionally providing a total voltage monitoring circuit in battery pack 10C.

Embodiment 5

Embodiment 3 employs daisy-chain communication so as to reduce the number of wires. However, if the number of battery blocks is not so large, a so-called star-configuration communication system may be employed in which SBMs are individually connected to a battery ECU by wire.

Figure 9:
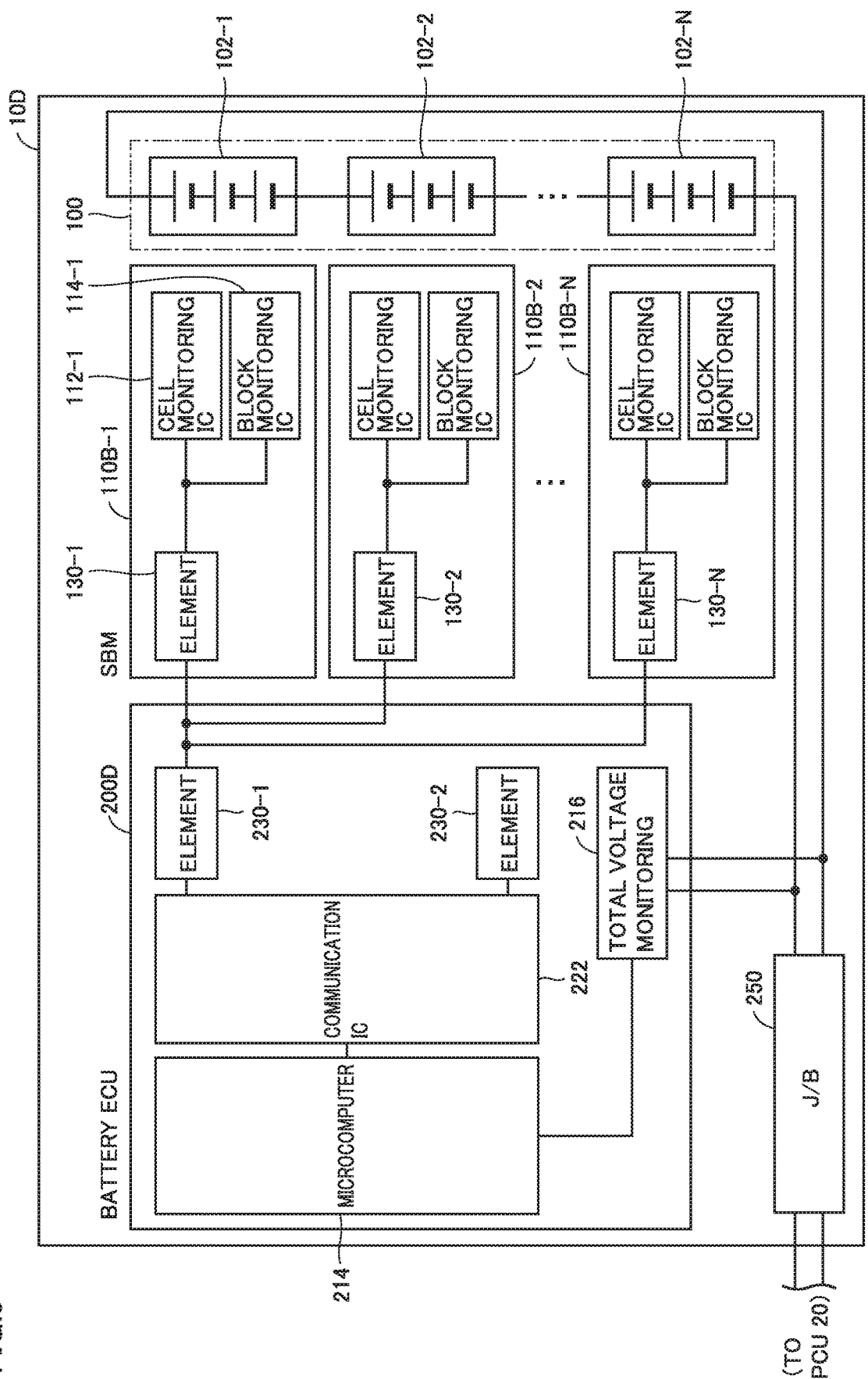
FIG. 9 is a configuration diagram of a battery pack according to embodiment 5.

FIG. 9 is a configuration diagram of a battery pack according to embodiment 5. With reference to FIG. 9, battery pack 10D includes assembled battery 100, a plurality of SBMs 110B-1 to 110B-N, battery ECU 200D, and J/B 250.

SBMs 110B-1 to 110B-N are provided corresponding to battery blocks 102-1 to 102-N, respectively. SBM 110B-1 includes cell monitoring IC 112-1, block monitoring IC 114-1, and element 130-1. These devices are arranged on a substrate appropriately to constitute SBM 110B-1.

Element 130-1 is an insulating element for communicating with battery ECU 200D by wire while electrically insulating battery ECU 200D from SBM 110B-1. SBM 110B-1 is a high-voltage substrate, whereas battery ECU 200D is a low-voltage substrate, and element 130-1 electrically insulates SBM 110B-1 and battery ECU 200D from each other. Element 130-1 is, for example, a pulse transformer, a photocoupler or the like.

The other SBMs 110B-2 to 110B-N have the same configuration as SBM 110B-1. Specifically, in each of SBMs 110B-2 to 110B-N, the voltage of each cell and the block voltage of the corresponding battery block are monitored by the cell monitoring IC and the block monitoring IC, and the voltage monitoring results are directly transmitted to battery ECU 200D by wire.

Battery ECU 200D has the same configuration as battery ECU 200B shown in FIG. 7, except that it includes elements 230-1, 230-2, instead of elements 220-1, 220-2. Element 230-1 is an insulating element for communicating with each of SBMs 110B-1 to 110B-N by wire while electrically insulating each of SBMs 110B-1 to 110B-N from battery ECU 200D. Element 230-1 is, for example, a pulse transformer, a photocoupler or the like.

Element 230-2 is provided for a backup for element 230-1. Although not shown, element 230-2 is also connected to each of SBMs 110B-1 to 110B-N by wire. In battery ECU 200D, the system of reception from SBMs 110B-1 to 110B-N is redundant so as to avoid a situation where microcomputer 214 cannot receive any of the monitoring results of SBMs 110B-1 to 110B-N due to a failure in element 230-1.

Communication IC 222 receives the voltage monitoring result output from each of SBMs 110B-1 to 110B-N, from element 230-1 (or element 230-2 when element 230-1 is failed). Also, communication IC 222 outputs, to microcomputer 214, the received voltage monitoring result of each of battery blocks 102-1 to 102-N.

The flowchart of the process to be executed by microcomputer 214 of battery ECU 200D is the same as the flowchart in embodiment 1 shown in FIG. 4.

As described above, embodiment 5 can also provide a backup with a simple configuration without building a redundant system for each SBM in preparation for a failure in a SBM.

Embodiment 6

In embodiment 6, the total voltage of assembled battery 100 is monitored using voltage sensor 26 provided in PCU 20 which receives electric power from the battery pack, instead of total voltage monitoring circuit 216 provided in battery pack 10D in embodiment 5. Embodiment 6 in relation to embodiment 5 corresponds to embodiment 2 in relation to embodiment 1.

Figure 10:
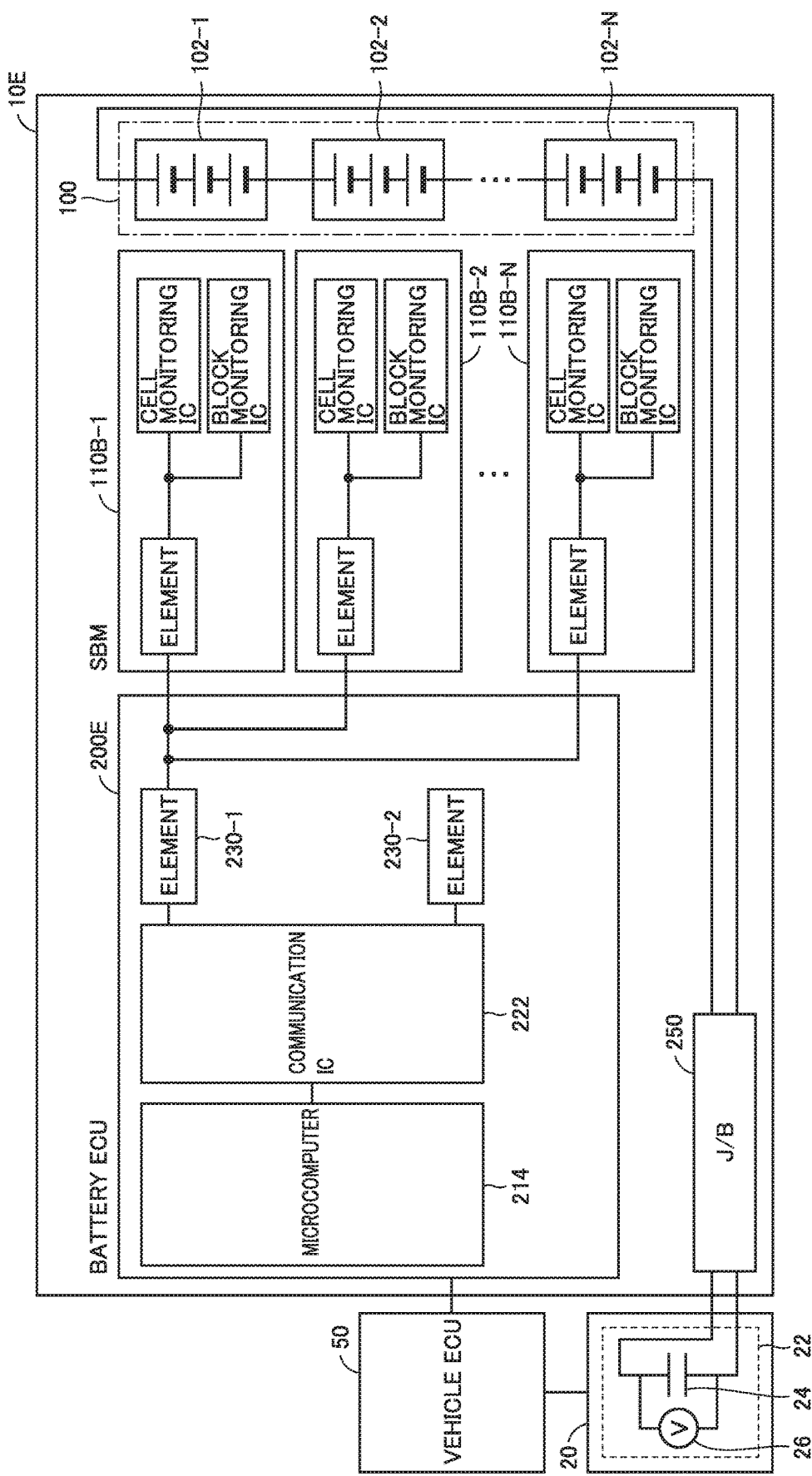
FIG. 10 is a configuration diagram of a battery system to which a battery monitoring device according to embodiment 6 is applicable.

FIG. 10 is a configuration diagram of a battery system to which a battery monitoring device according to embodiment 6 is applicable. With reference to FIG. 10, in this battery system, battery pack 10E has the same configuration as battery pack 10D in embodiment 5 shown in FIG. 9, except that it includes battery ECU 200E instead of battery ECU 200D. Battery ECU 200E has the same configuration as battery ECU 200D, but without total voltage monitoring circuit 216.

PCU 20 includes voltage monitoring circuit 22 to monitor the voltage output from assembled battery 100 of battery pack 10E. The configuration of PCU 20 is as described above with reference to FIG. 5. Specifically, voltage sensor 26 detects the voltage across capacitor 24 (the total voltage of assembled battery 100), and outputs the detection value to vehicle ECU 50. When vehicle ECU 50 receives the voltage detection value from voltage sensor 26, vehicle ECU 50 transmits the detection value to battery ECU 200E of battery pack 10E. Thus, the total voltage of assembled battery 100 is detected using voltage sensor 26 of PCU 20, and the detection value is transmitted to battery ECU 200E of battery pack 10E through vehicle ECU 50.

The flowchart of the process to be executed by microcomputer 214 of battery ECU 200E is the same as the flowchart in embodiment 2 shown in FIG. 6.

As described above, according to embodiment 6, the voltage (total voltage) of assembled battery 100 is monitored using voltage sensor 26 provided in PCU 20. Accordingly, the voltage of the battery block corresponding to a failed SBM can be calculated without additionally providing a total voltage monitoring circuit in battery pack 10E.

In the above-described embodiments, each SBM uses a common antenna or element to transmit, to the battery ECU, the monitoring result of the voltage of each cell obtained by the cell monitoring IC and the monitoring result of the block voltage obtained by the block monitoring IC. However, the communication paths of both monitoring results do not necessarily have to be the same. That is, if the communication paths are wireless, an antenna and/or communication IC for transmitting the monitoring result obtained by the cell monitoring IC to the battery ECU may be provided separately from an antenna and/or communication IC for transmitting the monitoring result obtained by the block monitoring IC to the battery ECU.

Further, in the above-described embodiments, each SBM does not necessarily have to monitor both the voltage of each cell, using the cell monitoring IC, and the voltage of the battery block, using the block monitoring IC. Instead, each SBM may monitor only one of these voltages. For example, the block voltage may be monitored not directly but through calculation by adding up the voltages of the cells. Note, however, that monitoring both the voltage of each cell and the block voltage in each SBM has the advantage that, if a voltage of a cell cannot be acquired, the voltage of this cell can be calculated based on the sum of the voltages of the remaining cells and the block voltage.

Although embodiments of the present disclosure have been described, it should be understood that the embodiments disclosed herein are by way of example in every respect, not by way of limitation. The scope of the present disclosure is defined by the terms of the claims, and is intended to include any modification within the meaning and the scope equivalent to the terms of the claims.

What is claimed is:

1. A battery pack comprising:
an assembled battery that includes a plurality of battery blocks connected in series, each of the plurality of battery blocks including a plurality of cells;
a plurality of monitoring modules provided corresponding to the plurality of battery blocks, each of the plurality of monitoring modules monitoring at least one of a voltage of each cell included in a corresponding battery block, and a voltage of the corresponding battery block;
a total voltage monitoring device that monitors a total voltage of the assembled battery, separately from the plurality of monitoring modules; and
a control device that receives a voltage monitoring result obtained by each of the plurality of monitoring modules, and receives a monitoring result of the total voltage obtained by the total voltage monitoring device, wherein the control device calculates, when any of the plurality of monitoring modules is failed, the voltage of a battery block corresponding to the failed monitoring module, based on the voltage monitoring result obtained by each of remaining monitoring modules and the monitoring result of the total voltage.

2. The battery pack according to claim 1, wherein each of the plurality of monitoring modules includes a transmitting device that transmits the voltage monitoring result to the control device, the control device includes a receiving device that receives the voltage monitoring result from each of the plurality of monitoring modules, and the transmitting device and the receiving device communicate with each other wirelessly.

3. The battery pack according to claim 1, wherein the plurality of monitoring modules constitute a daisy chain that performs bidirectional communication, each of the plurality of monitoring modules transmits the voltage monitoring result to an adjacent monitoring module, and two monitoring modules at ends of the daisy chain among the plurality of monitoring modules communicate with the control device.

4. The battery pack according to claim 1, wherein each of the plurality of monitoring modules includes a cell monitoring device that monitors the voltage of each cell included in the corresponding battery block, a block monitoring device that monitors the voltage of the corresponding battery block, and a transmitting device that transmits a monitoring result obtained by the cell monitoring device and a monitoring result obtained by the block monitoring device to the control device.

5. A vehicle comprising:
the battery pack according to claim 1; and
an electric motor that generates a driving force for travel by receiving electric power from the battery pack.

6. A battery monitoring device that monitors an assembled battery constituted of a plurality of battery blocks connected in series, each of the plurality of battery blocks including a plurality of cells, the battery monitoring device comprising:

a plurality of monitoring modules provided corresponding to the plurality of battery blocks, each of the plurality of monitoring modules monitoring at least one of a voltage of each cell included in a corresponding battery block, and a voltage of the corresponding battery block;

a voltage sensor that monitors a voltage of the assembled battery in an electrical device that receives electric power from the assembled battery; and a control device that receives a voltage monitoring result obtained by each of the plurality of monitoring modules, and receives a monitoring result of the voltage of the assembled battery obtained by the voltage sensor, wherein the control device calculates, when any of the plurality of monitoring modules is failed, the voltage of a battery block corresponding to the failed monitoring module, based on the voltage monitoring result obtained by each of remaining monitoring modules and the monitoring result of the voltage of the assembled battery.

7. A vehicle comprising:
an assembled battery that includes a plurality of battery blocks connected in series, each of the plurality of battery blocks including a plurality of cells;
the battery monitoring device according to claim 6, that monitors the assembled battery; and
an electric motor that generates a driving force for travel by receiving electric power from the assembled battery.

* * * * *